(12) United States Patent
Lin et al.

(10) Patent No.: US 6,822,518 B1
(45) Date of Patent: Nov. 23, 2004

(54) LOW NOISE AMPLIFIER

(75) Inventors: Ying-Hsi Lin, Hsin-Chu (TW);
Chinq-Shiun Chiu, Hsin-Chu (TW)

(73) Assignee: Realtek Semiconductor Corp., HsinChu (TW)

(*) Notice: Subject to any disclaimer, the term of this patent is extended or adjusted under 35 U.S.C. 154(b) by 0 days.

(21) Appl. No.: 10/249,674

(22) Filed: Apr. 29, 2003

(51) Int. Cl.[7] .............................................. H03F 1/22
(52) U.S. Cl. .................................... 330/296; 330/311
(58) Field of Search ............................... 330/288, 296, 330/307, 310, 311

(56) References Cited

U.S. PATENT DOCUMENTS

| | | | |
|---|---|---|---|
| 6,363,127 B1 | 3/2002 | Heinonen | |
| 6,392,490 B1 | * 5/2002 | Gramegna et al. | 330/296 |
| 6,392,492 B1 | * 5/2002 | Yuan | 330/311 |
| 6,574,292 B2 | 6/2003 | Heinonen | |
| 2002/0090042 A1 | 7/2002 | Heinonen | |
| 2004/0041215 A1 | * 3/2004 | Chaine et al. | 257/401 |

* cited by examiner

Primary Examiner—Steven J. Mottola
(74) Attorney, Agent, or Firm—Winston Hsu

(57) ABSTRACT

A low noise amplifier (LNA) includes first and second transistors, an inductor, and a first resistor. The gate of the first transistor is connected to an RF input node, the source being connected to a first ground node. The source of the second transistor is connected to the drain of the first transistor, the drain of the second transistor being connected to an RF output node and the gate being connected to a first bias voltage. The first resistor and the inductor are connected in parallel between the RF output node and a supply voltage. The first resistor is selected such that the LNA resonant frequency is greater than 1.5 times an operating frequency. In a CMOS circuit, the source of the transistor in the current mirror circuit, the first ground node, and the capacitor are each connected to ground through three separate ground paths having parasitic inductances provided by three off-chip bonding wires.

22 Claims, 6 Drawing Sheets

LOW NOISE AMPLIFIER

BACKGROUND OF INVENTION

1. Field of the Invention

The present invention relates to radio frequency electronics, and more specifically, to a low noise amplifier.

2. Description of the Prior Art

Low noise amplifiers (LNAs) are used in a wide variety of applications such as RF communication systems including wireless computer networks and mobile phones. As demand for these systems becomes widespread, the need to improve and refine LNAs increases with the aim of improving performance, reliability, and cost.

FIG. 1 illustrates a conventional LNA 10, in which a dashed line separates on-chip components from off-chip ones. The LNA 10 includes a transistor 22 having a drain applied with a supply voltage Vdd through a first inductor 26. An input RF signal is applied to a gate of the transistor 22 through a second inductor 28, while output of the LNA 10 is taken from the drain of the transistor 22. The gate of the transistor 22 is further connected to a current mirror circuit 24, which provides a predetermined bias current. A source of the transistor 22 is connected to a ground 12 via an on-chip node Q that also grounds the current mirror circuit 24. Operation of the LNA 10 is well known in the art with the input RF signal being amplified according to the voltage Vdd, the bias current, and the inductances of the inductors 26,28.

When the LNA 10 is manufactured according to CMOS processes, all the above components are installed on-chip except for the single off-chip ground 12. U.S. Pat. No. 5,574,405, which is incorporated herein by reference, thoroughly describes the advantages of on-chip components for an LNA similar to that of FIG. 1. Despite these advantages, the on-chip connection at node Q results in poor isolation and stability, and increased susceptibility to noise. Other shortcomings of the LNA 10 include a relatively narrow bandwidth and increased chip area from inductor 28.

Another prior art LNA is described in U.S. Pat. No. 6,198,352, which is incorporated herein by reference. Among other components, such an LNA includes a resistance in place of the second inductor 28 of the LNA 10. Hence, further disadvantages of this type of LNA include a DC-mode resistance and corresponding power loss, and an uncertainty in the drain voltage of the transistor 22 or its equivalent.

In summary, prior art LNAs, such as the LNA 10, are in need of improvements regarding performance and manufacture in order to provide effective functionality to modern communications devices.

SUMMARY OF INVENTION

It is therefore a primary objective of the claimed invention to provide a low noise amplifier having improved structure and manufacturability to solve the above prior art problems.

Briefly summarized, the claimed invention includes a first transistor, a second transistor, an inductor, and a first resistor. The gate of the first transistor is connected to an RF input node, and the source is connected to a first ground node. The source of the second transistor is connected to a drain of the first transistor. The drain of the second transistor is connected to an RF output node, while the gate is connected to a first bias voltage. Further provided is a current mirror circuit connected to the gate of the first transistor for providing a predetermined bias current. The inductor is connected between the RF output node and a supply voltage node. The first resistor is also connected between the RF output node and the supply voltage node, the first resistor being in parallel with the inductor.

According to the claimed invention, the resistance of the first resistor is selected such that a ratio of the inductance of the inductor to the resistance of the first resistor results in a resonant frequency seen at the RF output being greater than 1.5 times a predetermined operating frequency.

According to the claimed invention, a source of a transistor in the current mirror, the first ground node, and a capacitor are each connected to ground through three separate ground paths each having a parasitic inductance. And further, the first and second transistors, the inductor, and the first resistor can be formed on a substrate by a CMOS process, the parasitic inductances of the three separate ground paths being substantially entirely provided by three separate off-chip bonding wires.

According to the claimed invention, the first and second transistors, the inductor, and the first resistor are formed on a substrate by a CMOS process, with the first and second transistors being formed in a single deep N-well.

It is an advantage of the claimed invention that the first resistor allows the bandwidth of the LNA to be increased and the operating range to be flattened.

It is a further advantage of the claimed invention that three separate grounding paths for the source of the transistor in the current mirror, the first ground node, and the capacitor provide improved isolation and stability, and reduced noise.

It is a further advantage of the claimed invention that off-chip bonding wires provide the proper parasitic inductances to the components of the LNA, eliminating the need for specialized on chip inductors.

It is a further advantage of the claimed invention that noise is reduced by forming the first and second transistors in a single deep N-well of a CMOS circuit.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
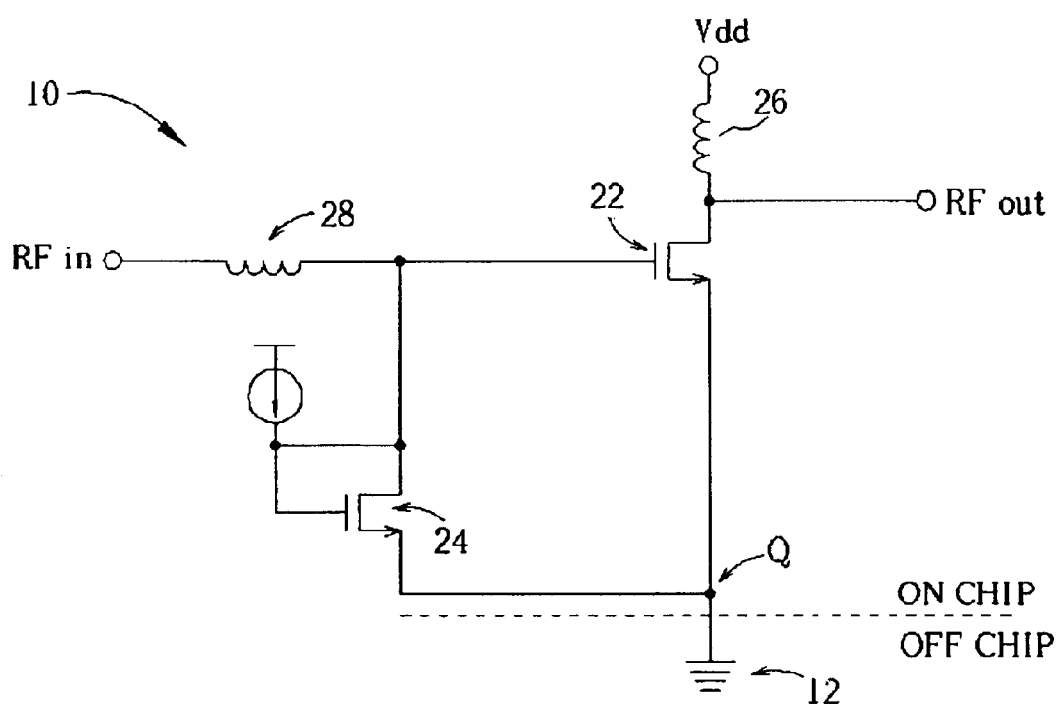
FIG. 1 is a circuit diagram of a prior art LNA.
Figure 2:
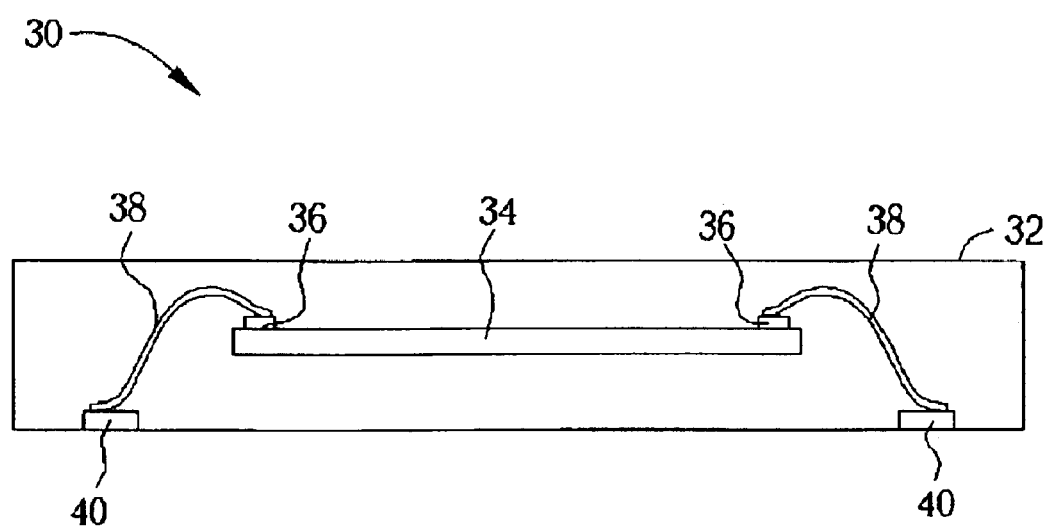
FIG. 2 is a cross-sectional view of a chip and package for housing the present invention LNA.

Please refer to FIG. 2, which illustrates a CMOS chip 30. The chip 30 includes a package 32 for protectively housing a chip die 34. The die 34 is electrically connected to external contacts 40 of the chip 30 through die contacts 36 and bonding wires 38. The die 34 comprises functional CMOS devices such as a low noise amplifier (LNA) according to the present invention. Thus, the chip 30 can be installed on a PCB or similar, such that the functional devices on the die 34 can be accessed.

Figure 3:
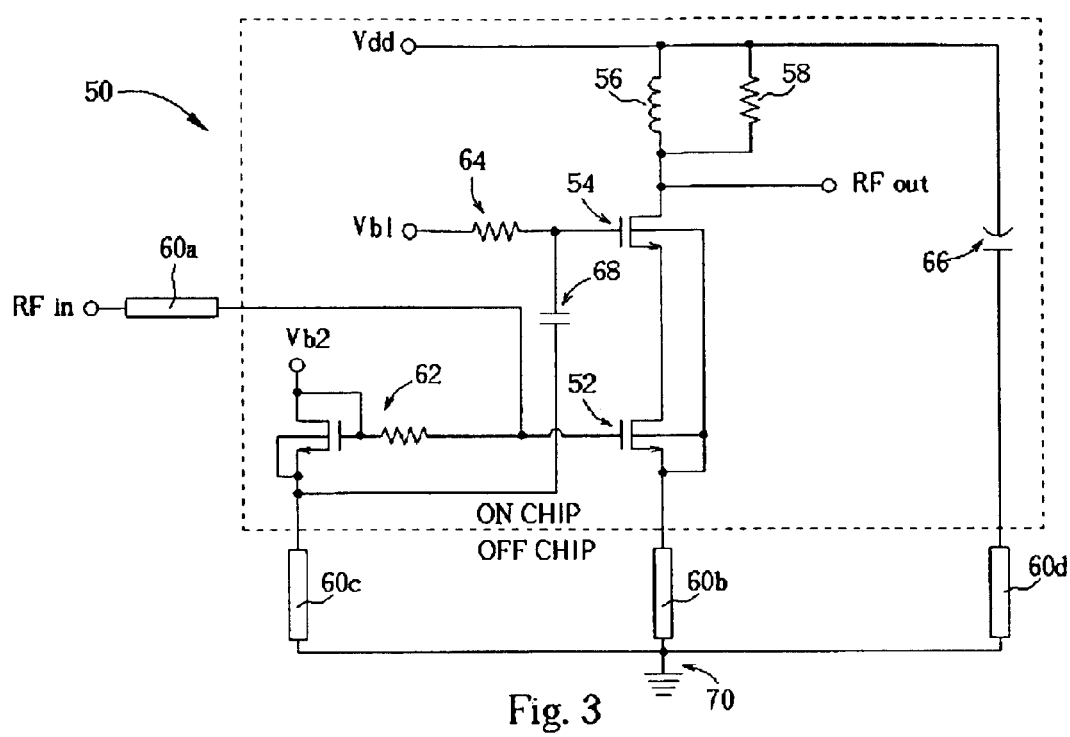
FIG. 3 is a circuit diagram of the present invention LNA.

FIG. 3 illustrates an LNA circuit 50 according to the present invention, with the dashed line separating on-chip components from off-chip ones. The LNA 50 includes a first transistor 52, a second transistor 54, and an inductor 56 and a first resistor 58 in parallel. The first and second transistors 52, 54 have grounded substrates, a drain of first transistor 52 being connected to a source of the second transistor 54. A gate of the first transistor 52 is connected to an RF input node, while a source of the first transistor 52 is connected to a common off-chip ground 70. A gate of the second transistor 54 is connected to a first bias voltage Vb1, and a drain is connected to a supply voltage Vdd through the inductor 56 and the first resistor 58. Output of the LNA 50 is taken from the drain of the second transistor 54.

In CMOS applications, the gate of the first transistor 52 is connected to the RF input node through an off-chip bonding wire 60a, and the source of the first transistor 52 is connected to ground through a similar bonding wire 60b. The bonding wires 60a, 60b are similar to the bonding wires 38 of FIG. 2, providing electrical connections to off-chip components. According to the present invention, the dimensions and material of the bonding wires 60a, 60b are specifically selected to provide desired inherent parasitic inductances to the RF input and ground connections respectively. That is, the present invention does not require discrete off-chip inductors to provide these parasitic inductances.

The LNA 50 further comprises a current mirror circuit 62, a second resistor 64, a capacitor 66, and a capacitor 68. As is well known in the art, the current mirror 62 is employed to generate a DC current that is a constant multiple of a reference current. The current mirror circuit 62 comprises a transistor and resistor and is connected to the gate of the first transistor 52. In the current mirror circuit 62, the included resistor is connected between a gate of the included transistor and the gate of the first transistor 52, a source of the included transistor is grounded, and a drain of the included transistor is connected to the gate. The current mirror circuit 62 receives a second bias voltage Vb2 at the gate and at a drain of the included transistor. The second resistor 64 is disposed between the gate of the second transistor 54 and the first bias voltage Vb1. The capacitor 66 is connected between the supply voltage Vdd and the off-chip ground 70. The capacitor 68 is connected between the source of the transistor of the current mirror 62 and the gate of the second transistor 54. Further, off-chip bonding wires 60c and 60d are provided to ground the current mirror circuit 62 and the capacitor 66 respectively. As with the bonding wires 60a, 60b, the bonding wires 60c, 60d have dimensions and material designed to provide the required parasitic inductances.

Referring to FIG. 3, the LNA 50 has three separate on-chip ground paths that are only mutually connected at the off-chip ground 70. The off-chip bonding wires 60b, 60c, 60d provide these three distinct ground paths, and improvements in isolation and stability and reduction of circuit noise is realized. In addition, the bonding wires 60a–60d replace parasitic inductors found in conventional LNAs, reducing chip area and fabrication costs.

Figure 4:
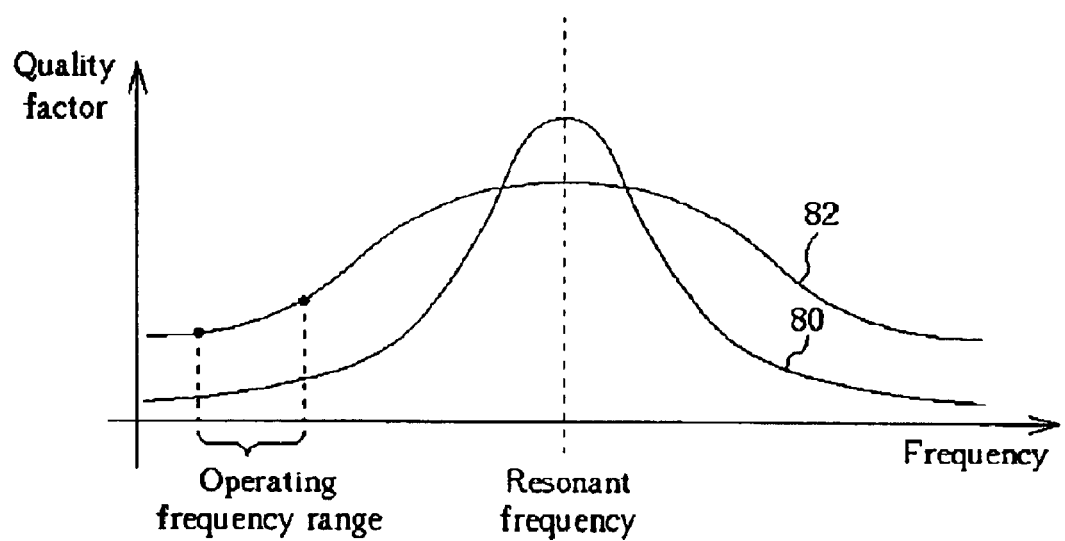
FIG. 4 is a graph of quality factor versus frequency for the LNA of FIG. 3FIG. 5 is a plan view of a CMOS layout of the transistors of FIG. 3.

In operation, an RF input signal is applied to the bonding wire 60a and received at the gate of the first transistor 52. Then, the input RF signal is amplified according to the first and second bias voltages Vb1 and Vb2, the supply voltage Vdd, and the ratio of the inductance of the inductor 56 to the resistance of the first resistor 58. Finally, the amplified signal is output at the drain of the second transistor 54. In general, operation of the LNA 50 is similar to that of the prior art, and is well known in the art. For improved operation, the ratio of the inductance of the inductor 56 to the resistance of the first resistor 58 is selected such that the resonant frequency seen at the RF output is greater than 1.5 times the operating frequency range. Referring to FIG. 4, according to the present invention, the resistor 58 and inductor 56 are specifically selected to reduce the quality factor and improve the bandwidth (curve 82), compared with a conventional LNA (curve 80). As provided for by the first resistor 58, a more stable power/voltage gain performance is achieved in the operating frequency range.

In operation, for a DC mode, the inductor 56 provides a path having negligible resistance, and allows the precise amount of current in the transistors 54, 52 to be known. For an AC mode, the resistor 58 reduces the parasitic resistance of the inductor 56.

Figure 5:
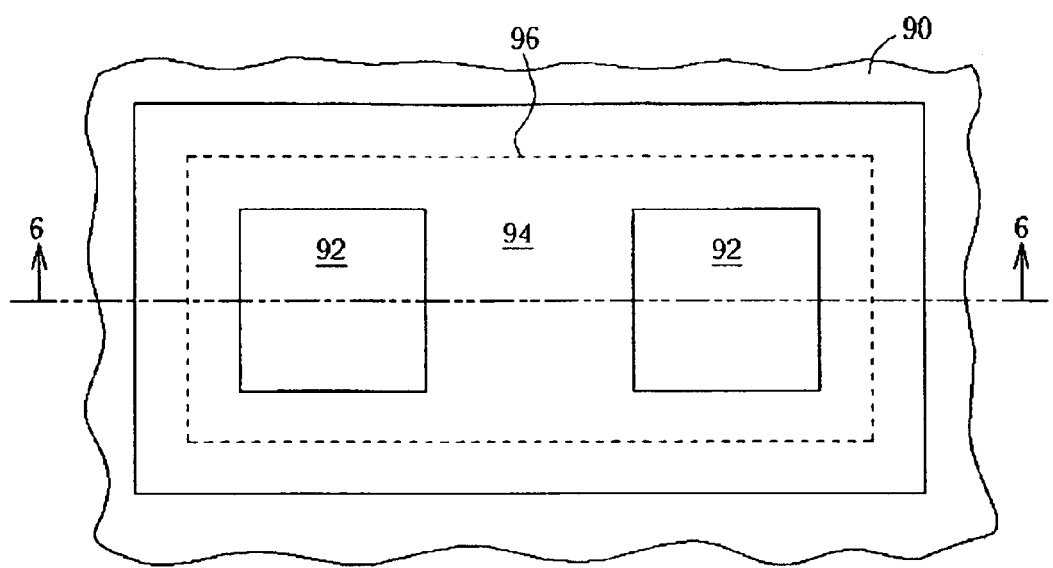
Figure 6:
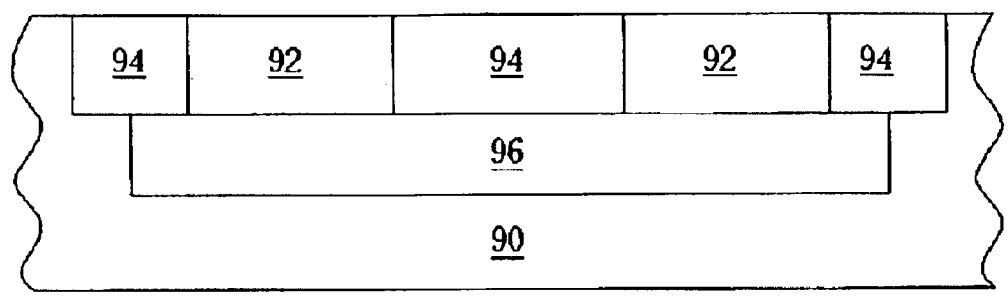
FIG. 6 is a cross-sectional view of FIG. 5.

In addition, for noise reduction in CMOS applications, the first and second transistors 52, 54 of the present invention LNA 50 can be manufactured using a common deep N-well formed in a suitable substrate. FIG. 5 illustrates a plan view and FIG. 6 illustrates a cross-sectional view of a CMOS structure for forming the first and second transistors 52, 54. In a substrate 90, two P-wells 92 are formed in a single N-well 94 atop a single deep N-well 96. Manufacture and operation of the structure shown in FIG. 5 and FIG. 6 is well known in the art.

In contrast to the prior art, the present invention provides an LNA having a first resistor connected in parallel with an inductor between a supply voltage and a drain of a second transistor. The resistance of the first resistor is selected to increase the bandwidth of the LNA and to make the response of the LNA more linear in the operating frequency range. The LNA also includes three separate on-chip grounding paths that are only joined to a common ground off-chip by external bonding wires, which are specifically selected to provide suitable parasitic inductances. A similar external bonding wire is also provided for the RF input. The bonding wires afford the present invention improved isolation and stability, and reduced noise, and further eliminate a need for specialized on-chip or off-chip inductor. Finally, the two transistors of the present invention LNA are disposed in a single deep N-well of a CMOS circuit to further reduce noise.

Those skilled in the art will readily observe that numerous modifications and alterations of the device may be made while retaining the teachings of the invention. Accordingly, the above disclosure should be construed as limited only by the meters and bounds of the appended claims.

What is claimed is:

1. A low noise amplifier comprising:
   a first transistor having a gate connected to an RF input node and a source connected to a first ground node;
   a second transistor having a source connected to a drain of the first transistor, a drain connected to an RF output node, and a gate connected to a first bias voltage;
   an inductor connected between the RF output node and a supply voltage node;
   a first resistor connected between the RF output node and the supply voltage node, the first resistor in parallel with the inductor, and
   a current mirror circuit connected to the RF input node for providing a predetermined bias current;
   wherein a source of a transistor in the current mirror circuit, the first ground node, and a capacitor are each connected to a ground through three separate ground paths each having a parasitic inductance.

2. The low noise amplifier of claim 1 wherein the resistance of the first resistor is selected such that a ratio of the inductance of the inductor to the resistance of the first resistor results in a resonant frequency seen at the RF output being grater than 1.5 times a predetermined operating frequency.

3. The low noise amplifier of claim 1 wherein the first and second transistors, the inductor, and the first resistor are formed on a substrate by a CMOS process, and the parasitic inductances of the three separate ground paths are substantially entirely provided by three separate off-chip bonding wires.

4. The low noise amplifier of claim 3 wherein the first and second transistors are formed in a single deep N-well formed in the substrate.

5. The low noise amplifier of claim 1 wherein the first and second transistors, the inductor, and the first resistor are formed on a substrate by a CMOS process.

6. The low noise amplifier of claim 5 wherein the first and second transistors are formed in a single deep N-well formed in the substrate.

7. The low noise amplifier of claim 5 further comprising an input bonding wire connecting the RF input node and the gate of the first transistor for providing an input inductance.

8. The low noise amplifier of claim 5 further comprising a first bonding wire connecting the first ground node and the source of the first transistor for providing a first parasitic inductance.

9. The low noise amplifier of claim 5 further comprising a second bonding wire connecting the current mirror circuit to a second ground node for providing a second parasitic inductance.

10. The low noise amplifier of claim 5 further comprising a capacitor disposed on the substrate and connected to the supply voltage node, and a third bonding wire connecting the capacitor to a third ground node for providing a third parasitic inductance.

11. The low noise amplifier of claim 1 further comprising a second resistor connected between the gate of the second transistor and the first bias voltage.

12. The low noise amplifier of claim 5 further comprising a capacitor connected between the gate of the second transistor and a source of a transistor in the current mirror circuit.

13. A low noise amplifier manufactured according to a CMOS process, the low noise amplifier comprising:
   a substrate;
   a first ground node connected to the substrate by a first bonding wire, the first bonding wire providing a first parasitic inductance;
   a first transistor formed on the substrate in a deep N-well, the first transistor having a gate connected to an RF input node and a source connected to the first ground node;
   a second transistor formed on the substrate in the deep N-well, the second transistor having a source connected to a drain of the first transistor, a drain connected to an RF output node, and a gate connected to a first bias voltage;
   an inductor formed on the substrate connected between the RF output node and a supply voltage node;
   a first resistor formed on the substrate connected between the RF output node and the supply voltage node, the first resistor in parallel with the inductor; and
   a current mirror circuit disposed on the substrate and connected to the RF input node for producing a predetermined bias current.

14. The low noise amplifier of claim 13 wherein the resistance of the first resistor is selected such that the ratio of the inductance of the inductor to the resistance of the first resistor results in a resonant frequency seen at the RF output being greater than 1.5 times an operating frequency.

15. The low noise amplifier of claim 13 further comprising an input bonding wire connecting the RF input node and the gate of the first transistor for providing an input inductance.

16. The low noise amplifier of claim 13 further comprising a second bonding wire connecting the current mirror circuit to a second ground node for providing a second parasitic inductance.

17. The low noise amplifier of claim 13 further comprising a capacitor disposed on the substrate and connected to the supply voltage node, and a third bonding wire connecting the capacitor to a third ground node for providing a third parasitic inductance.

18. The low noise amplifier of claim 13 further comprising a second resistor connected between the gate of the second transistor and the first bias voltage.

19. A method of amplifying an input radio frequency signal, the method comprising:
   receiving the input radio frequency signal at a radio input node and applying a supply voltage to a supply voltage node;
   grounding the input radio frequency signal and the supply voltage through three separate ground paths, each ground path providing a parasitic inductance; and
   amplifying the input radio frequency signal with a cascode low noise amplifier comprising a first transistor and a second transistor with the supply voltage according to a resonant frequency, the resonant frequency controlled by a resistance and a parallel inductance between the radio frequency input node and the supply voltage node, wherein the first and the second transistors are formed in a single deep N-well formed in a substrate.

20. The method of claim 19 further comprising controlling the resistance and the inductance to set the resonant frequency greater than 1.5 times the input radio frequency.

21. A CMOS chip comprising a low noise amplifier, a chip package, and bonding wires for performing the method of claim 19.

22. A low noise amplifier comprising:
   a first transistor having a gate connected to an RF input node and a source connected to a first ground node;
   a second transistor having a source connected to a drain of the first transistor, a drain connected to an RF output node, and a gate connected to a first bias voltage, wherein the first and second transistors are formed in a single deep N-well formed in the substrate;
   an inductor connected between the RF output node and a supply voltage node;
   a first resistor connected between the RF output node and the supply voltage node, the first resistor in parallel with the inductor; and
   a current mirror circuit connected to the RF input node for providing a predetermined bias current.

* * * * *